United States Patent [19]
Mohindra et al.

[11] Patent Number: 5,932,027
[45] Date of Patent: *Aug. 3, 1999

[54] CLEANING AND DRYING PHOTORESIST COATED WAFERS

[75] Inventors: Raj Mohindra, Los Altos; Abhay Bhushan, Palo Alto; Rajiv Bhushan, Mountain View; Suraj Puri, Los Altos; John H. Anderson, Sr., Milpitas; Jeffrey Nowell, San Francisco, all of Calif.

[73] Assignee: YieldUP International, Mountain View, Calif.

[ * ] Notice: This patent is subject to a terminal disclaimer.

[21] Appl. No.: 09/005,976

[22] Filed: Jan. 12, 1998

Related U.S. Application Data

[63] Continuation of application No. 08/555,634, Nov. 8, 1995, Pat. No. 5,772,784, which is a continuation-in-part of application No. 08/437,541, May 9, 1995, Pat. No. 5,571,337, which is a continuation-in-part of application No. 08/339,326, Nov. 14, 1994, Pat. No. 5,634,978.

[51] Int. Cl.$^6$ ............................... B08B 3/04; B08B 5/00
[52] U.S. Cl. ........................ 134/21; 134/2; 134/25.4; 134/25.5; 134/26; 134/37; 134/902; 134/30
[58] Field of Search ............................ 134/21, 25.4, 25.5, 134/26, 2, 30, 37, 902

[56] References Cited

U.S. PATENT DOCUMENTS

| | | | |
|---|---|---|---|
| 3,610,613 | 10/1971 | Worden et al. | 134/902 |
| 3,990,462 | 11/1976 | Elftmann et al. | 134/102.1 |
| 4,027,686 | 6/1977 | Shortes et al. | 134/102.1 |
| 4,256,229 | 3/1981 | Lee | 211/41.18 |
| 4,286,541 | 9/1981 | Blackwood | 134/102.1 |
| 4,354,514 | 10/1982 | Sundheimer et al. | 134/102.3 |
| 4,406,297 | 9/1983 | Walton | 134/102.3 |
| 4,633,893 | 1/1987 | McConnell et al. | 134/95 |
| 4,653,636 | 3/1987 | Armstrong | 211/41.18 |

(List continued on next page.)

FOREIGN PATENT DOCUMENTS

| | | |
|---|---|---|
| 385 536 | 5/1990 | European Pat. Off. . |
| 61-46016 | 6/1986 | Japan . |
| 61-88534 | 6/1986 | Japan . |
| 61-284927 | 12/1986 | Japan . |
| 62-188323 | 8/1987 | Japan . |
| 3-124026 | 5/1991 | Japan . |
| 4-65828 | 3/1992 | Japan . |

(List continued on next page.)

OTHER PUBLICATIONS

M. Itano, F.W. Kern, Jr., R.W. Rosenberg, M. Miyashita, I. Kawanabe, and T. Ohmi, "Particle Deposition and Removal in Wet Cleaning Processes for ULSI Manufacturing", IEEE Trans. on Semiconductor Manufacturing, vol. 5, No. 2, pp. 114–120, May 1992.

Y. Yagi, T. Imaoka, Y. Kasama, and T. Ohmi, "Advanced Ultrapure Water Systems with Low Dissolved Oxygen for Native Oxide Free Wafer Processing", IEEE Trans. On Semiconductor Manufacturing, vol. 5, No. 2, pp. 121–127, May 1992.

(List continued on next page.)

*Primary Examiner*—Zeinab El-Arini
*Attorney, Agent, or Firm*—Townsend and Townsend and Crew LLP

[57] ABSTRACT

A method for cleaning a semiconductor wafer. The method includes immersing a wafer in a liquid having water. The wafer has a front face, a back face, and an edge. The method also includes providing a substantially particle free environment adjacent to the front face and the back face as the liquid is being removed. A step of introducing a carrier gas having a cleaning enhancement substance during the providing step also is included. The cleaning enhancement substance dopes the liquid which is attached to the front face and the back face to cause a concentration gradient of the cleaning enhancement substance in the attached liquid to accelerate fluid flow of the attached liquid off of the wafer.

31 Claims, 9 Drawing Sheets

U.S. PATENT DOCUMENTS

| | | | |
|---|---|---|---|
| 4,676,008 | 6/1987 | Armstrong | 211/41.18 |
| 4,694,527 | 9/1987 | Yoshizawa | 134/902 |
| 4,750,505 | 6/1988 | Inuta et al. | 134/153 |
| 4,778,532 | 10/1988 | McConnell et al. | 134/10 |
| 4,871,417 | 10/1989 | Nishiawa et al. | 156/640 |
| 4,874,014 | 10/1989 | Grant et al. | 137/606 |
| 4,911,761 | 3/1990 | McConnell et al. | 134/11 |
| 4,917,123 | 4/1990 | McConnell et al. | 134/95 |
| 4,982,753 | 1/1991 | Grebinski, Jr. et al. | 134/102.1 |
| 4,984,597 | 1/1991 | McConnell et al. | 134/95 |
| 4,987,687 | 1/1991 | Sugimoto | 34/58 |
| 4,993,559 | 2/1991 | Cota | 211/41.18 |
| 5,022,419 | 6/1991 | Thompson et al. | 134/102.1 |
| 5,082,518 | 1/1992 | Molinaro | 156/345 |
| 5,129,955 | 7/1992 | Tanaka | 134/2 |
| 5,143,103 | 9/1992 | Basso et al. | 134/98.1 |
| 5,149,244 | 9/1992 | Webber et al. | 211/41.18 |
| 5,156,174 | 10/1992 | Thompson et al. | 134/153 |
| 5,169,408 | 12/1992 | Biggerstaff et al. | 29/250.1 |
| 5,186,192 | 2/1993 | Netsu et al. | 134/102.1 |
| 5,228,206 | 7/1993 | Grant et al. | 34/1 |
| 5,271,774 | 12/1993 | Leenaars et al. | 134/31 |
| 5,286,657 | 2/1994 | Bran | 437/9 |
| 5,301,701 | 4/1994 | Nafziger | 134/95.2 |
| 5,315,766 | 5/1994 | Roberson, Jr. et al. | 34/409 |
| 5,331,987 | 7/1994 | Hayashi et al. | 134/102.1 |
| 5,339,539 | 8/1994 | Shiraishi et al. | 34/58 |
| 5,370,142 | 12/1994 | Nishi et al. | 211/41.18 |
| 5,421,905 | 6/1995 | Ueno et al. | 134/25.4 |
| 5,634,978 | 6/1997 | Mohindra et al. | 134/2 |

FOREIGN PATENT DOCUMENTS

| | | |
|---|---|---|
| 4-833400 | 3/1992 | Japan . |
| 4-192419 | 7/1992 | Japan . |
| 4-251930 | 9/1992 | Japan . |
| 5-283386 | 10/1993 | Japan . |
| 5-283391 | 10/1993 | Japan . |
| 5-326464 | 12/1993 | Japan . |
| 6-120185 | 4/1994 | Japan . |
| 6-163500 | 6/1994 | Japan . |
| 6-177107 | 6/1994 | Japan . |
| 6-196401 | 7/1994 | Japan . |
| 6-163501 | 10/1994 | Japan . |

OTHER PUBLICATIONS

H.G. Parks, J.F. O'Hanlon, and F. Shadman, "Research Accomplishments at the University of Arizona Sematech Center of Excellence for Contamination/Defect Assessment and Control", IEEE Trans. on Semiconductor Manufacturing, vol. 6, No. 2, 134–142, May 1993.

C.S. Ackerman and J.M. Fabia, "Monitoring Supplier Quality at PPM Levels", IEEE Trans. on Semiconductor Manufacturing, vol. 6. No. 2, pp. 189–194, May 1993.

G.D. Moss, J.N. DiBello, K.P. Yanders, and R.F. Orr, "Capillary Drying: Particle–Free Wet–Process Drying?" No date.

T. Ohmi, Ultra Clean Technology Handbook, p. 290, 1993.

J. Marra, "Ultra Clean Marangoni Drying", pp. 269–282 No date.

C. McConnell, "Examining the Effects of Wafer Surface Chemistry on Particle Removal Using Direct–Displacement Isopropyl Alcohol Drying", MicroContamination, Feb. 1991.

P. Burggraaf, "Keeping the 'RCA' in Wet Chemistry Cleaning", Semiconductor International, pp. 86–90, Jun. 1994.

M.B. Olesen, "A Comparative Evaluation of the Spin Rinser/Dryer with the IPA Vapor Isodry Technique", Proceedings —Institute of Environmental Sciences, pp. 229–241, 1990.

D.J. Riley and R.G. Carbonell, "The Deposition of Contaminants from Deionized Water onto Hydrophobic Silicon Wafers", Journal of the IES, pp. 28–34, Nov./Dec. 1991.

N.D. Casper and B.W. Soren, "Semiconductor Yield Enchancement through Particle Control", Emerging Semiconductor Technology, pp. 423–435 No Date.

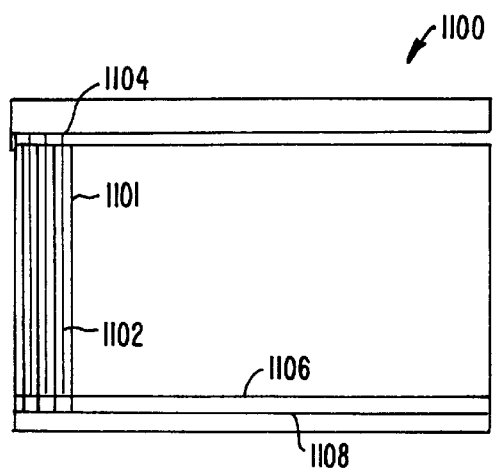
FIG. 11A.
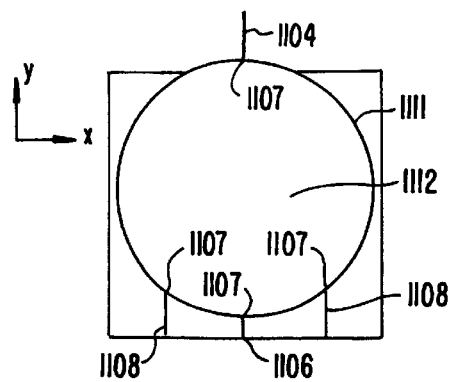
FIG. 11B.
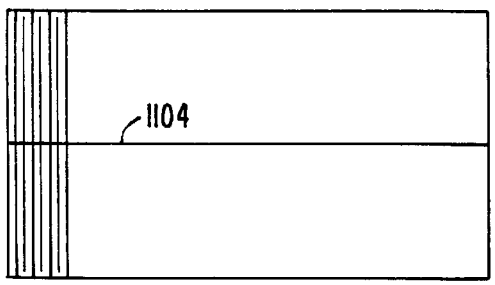
FIG. 11C.
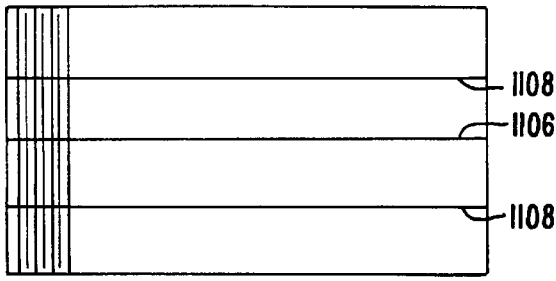
FIG. 11D.
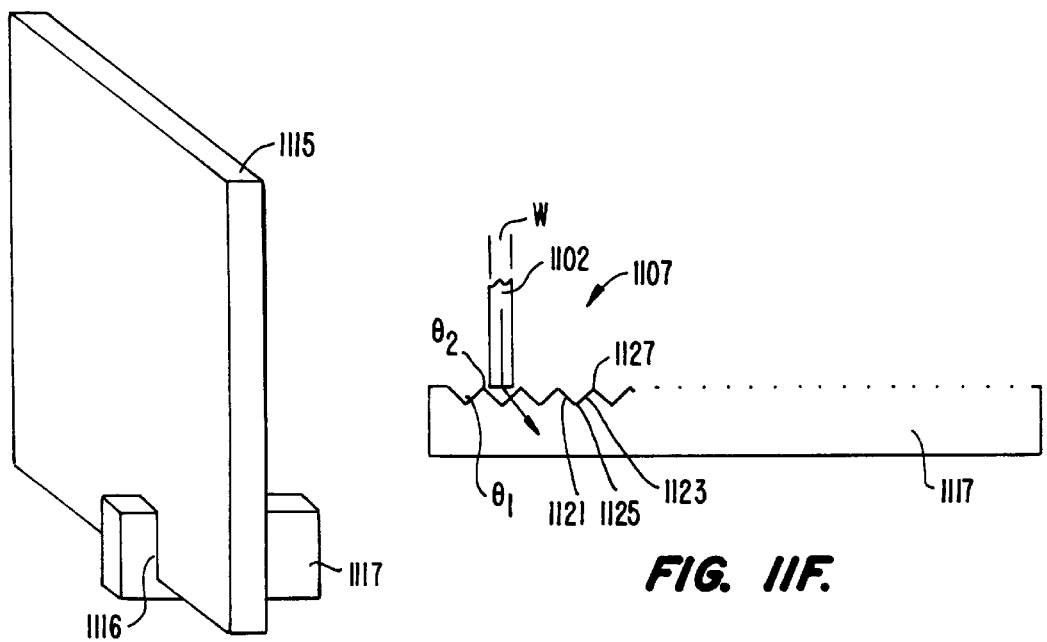
FIG. 11E.
FIG. 11F.

CLEANING AND DRYING PHOTORESIST COATED WAFERS

CROSS-REFERENCE TO RELATED APPLICATIONS

This application is a continuation of application Ser. No. 08/555,634, filed Nov. 8, 1995 now U.S. Pat. No. 5,772,784 (Attorney Docket No. 16911-000220), which is a continuation-in-part of application Ser. No. 08/437,541, filed May 9, 1995 now U.S. Pat. No. 5,571,337 (Attorney Docket No. 16911-000210), which is a continuation-in-part of application Ser. No. 08/339,326, filed Nov. 14, 1994 now U.S. Pat. No. 5,634,978 (Attorney Docket No. 16911-000200), all in the name of the present assignee, and all hereby incorporated by reference for all purposes.

BACKGROUND OF THE INVENTION

The present invention relates to the field of semiconductor integrated circuits. The invention is illustrated in an example with regard to a semiconductor integrated circuit cleaning technique, including a method and apparatus, but it will be recognized that the invention has a wider range of applicability. Merely by way of example, the invention can also be applied to the manufacture of raw wafers, lead frames, medical devices, disks and heads, flat panel displays, microelectronic masks, and other applications requiring high purity wet processing such as steps of rinsing, cleaning, drying, and the like.

Industry utilizes or has proposed various techniques to rinse and dry a semiconductor wafer. An example of a conventional technique used to rinse a wafer is a cascade rinse. The cascade rinse utilizes a cascade rinser which includes inner and outer chambers, each separated by a partition. Rinse water flows from a water source into the inner chamber. The rinse water from the inner chamber cascades into the outer chamber. An in-process wafer such as an etched wafer is typically rinsed in the cascade rinser by dipping the etched wafer into the rinse water of the inner chamber. This process is often used to neutralize and remove acid from the etched wafer.

A limitation with the cascade rinser is that "dirty water" often exists in the first chamber. The dirty water typically includes residual acid as well as "particles" which often attach to the wafer. These particles often cause defects in the integrated circuit, thereby reducing the number of good dies on a typical wafer. Another limitation with the cascade rinser is wafers from the cascade rinser must still undergo a drying operation. A subsequent drying operation often introduces more particles onto the integrated circuit. More particles on the integrated circuit typically further decrease the number of good dies on the wafer. Accordingly, the cascade rinse often cannot clean or remove particles from the wafer.

Another technique often used to rinse wafers is the "quick dump" method. The quick dump method relies upon the rapid deployment of water from the rinse tank to remove water and impurities from the semiconductor wafer. A limitation with this method is its inability to actually clean or remove particles from the wafer. In fact, the rapid deployment of water from the tank often transfers more particles onto the wafer. In addition, the wafers from the quick dump tank must still undergo a drying operation, further increasing the number of particles on the wafer. As previously noted, more particles often relates to lower die yields on the semiconductor wafer.

A further technique used to both rinse and dry wafers relies upon a spin rinse/dryer. The spin rinse/dryer uses a combination of rinse water spray to rinse and centrifugal force to remove water from the semiconductor wafer. The dry step often removes the water from the semiconductor wafer substantially by centrifugal force and evaporation. However, the spin rinse/dryer often introduces more particles onto the wafer. In fact, initially dissolved or suspended contaminants such as particles in the water are often left on the semiconductor wafer, thereby reducing the number of good dies on the wafer. Another limitation with the spin rinse/dryer is its complex mechanical design with moving parts and the like. The complex mechanical design often leads to certain problems such as greater downtime, wafer breakage, more spare parts, greater costs, among others. A further limitation is static electricity often builds up on the wafers during the spin cycle, thereby attracting even more particles onto the surface of the semiconductor. Accordingly, the spin rinse/drying does not clean or remove particles from the wafer.

Other techniques used to dry wafers include an isopropyl alcohol (IPA) vapor dryer, full displacement IPA dryer, and others. These IPA-type dryers often rely upon a large quantity of a solvent such as isopropyl alcohol and other volatile organic liquids to facilitate drying of the semiconductor wafer. An example of such a technique is described in U.S. Pat. No. 4,911,761, and its related applications, in the name of McConnell et al. and assigned to CFM Technologies, Inc. McConnell et al. generally describes the use of a superheated or saturated drying vapor as a drying fluid. This superheated or saturated drying vapor often requires the use of large quantities of a hot volatile organic material. The superheated or saturated drying vapor forms a thick organic vapor layer overlying the rinse water to displace (e.g., plug flow) such rinse water with the drying vapor. The thick organic vapor layer forms an azeotropic mixture with water, which will condense on wafer surfaces, and will then evaporate to dry the wafer.

A limitation with this type of dryer is its use of the large solvent quantity, which is hot, highly flammable, and extremely hazardous to health and the environment. Another limitation with such a dryer is its cost, which is often quite expensive. In fact, this dryer needs a vaporizer and condenser to handle the large quantities of hot volatile organic material. Still further, it has been determined that large quantities of hot volatile organic material are typically incompatible with most photoresist patterned wafers, and are also detrimental to certain device structures.

Still another technique relies upon a hot deionized (DI) process water to rinse and promote drying of the semiconductor wafer. By way of the hot DI water, the liquid on the wafer evaporates faster and more efficiently than standard room temperature DI water. However, hot water often produces stains on the wafer, and also promotes build-up of bacterial and other particles. Hot water can also damage the semiconductor, thereby reducing the amount of good dies on the wafer. Another limitation is water is often expensive to heat, and hot DI water is also an aggressive solvent. As an aggressive solvent, it often deteriorates equipment and facilities, thereby increasing maintenance operation costs.

As line size becomes smaller and the complexity of semiconductor integrated circuits increases, it is clearly desirable to have a cleaning technique, including a method and apparatus, that actually removes particles, prevents additional particles, and does not introduce stains on the wafers. The cleaning technique should also dry the wafers, without other adverse results. A further desirable characteristic includes reducing or possibly eliminating the residual water left on wafer surfaces and edges when water is removed (a meniscus). The water left on such surfaces and edges often attracts and introduces more particles onto the semiconductor wafer. The aforementioned conventional techniques fail to provide such desired features, thereby reducing the die yield on the semiconductor during wet processes.

From the above, it is seen that a cleaning method and apparatus for semiconductor integrated circuits that is safe, easy, and reliable is often desired.

SUMMARY OF THE INVENTION

The present invention provides a safe, efficient, and economical method and apparatus to clean an article (or object) such as a semiconductor wafer. In particular, the present method provides an improved technique that actually removes or reduces the amount of particles from the semiconductor substrate and also effectively cleans the substrate. The present method also provides an in situ cleaning system with substantially no mechanical movement of the substrate.

One aspect of the present invention provides a method for cleaning a semiconductor wafer. The present method includes immersing a wafer in a liquid comprising water. The wafer has a front face, a back face, and an edge. The method also includes providing a substantially particle free environment (e.g., ultra-clean gas, ultra-clean non-reactive gas, etc.) adjacent to the front face and the back face as the liquid is being removed. A step of introducing a carrier gas comprising a cleaning enhancement substance (e.g., trace amount of polar organic compound, helium, surfactants, carbon dioxide, etc.) during the providing step also is included. The cleaning enhancement substance dopes the liquid which is attached to the front face and the back face to cause a concentration gradient of the cleaning enhancement substance in the attached liquid to accelerate fluid flow of the attached liquid off of the wafer.

Another aspect of the invention provides an apparatus for cleaning a semiconductor wafer. The present apparatus includes a vessel adapted to immerse a wafer in a liquid comprising water. This wafer includes a front face, a back face, and an edge. The apparatus also includes a first control valve operably coupled to the vessel, and adapted to provide a substantially particle free environment adjacent to the front face and the back face as the liquid is being removed. A second control valve operably coupled to the vessel also is provided. The second control valve is adapted to introduce a carrier gas comprising a cleaning enhancement substance. The cleaning enhancement substance dopes the liquid which is attached to the front face and the back face to cause a concentration gradient of the cleaning enhancement substance in the attached liquid to accelerate fluid flow of the attached liquid off of the wafer.

A further alternative embodiment provides an apparatus for holding a plurality of substrates. The apparatus includes a lower support. The lower support comprises a plurality of first ridges, where each of the first ridges provides a support for a lower substrate portion. The apparatus also includes an upper support. The upper support comprises a plurality of second ridges, were each of the second ridges provides a support for an upper substrate portion. The lower substrate portion and the upper substrate portion are defined on a substrate. The first ridges and the second ridges draw liquid from the substrate.

A further understanding of the nature and advantages of the present invention may be realized by reference to the latter portions of the specification and attached drawings.

BRIEF DESCRIPTION OF THE DRAWINGS

FIGS. 11A–11F are simplified cross-sectional view diagrams of an alternative embodiment of a substrate carrier according to the present invention.

DESCRIPTION OF THE SPECIFIC EMBODIMENT

Figure 1:
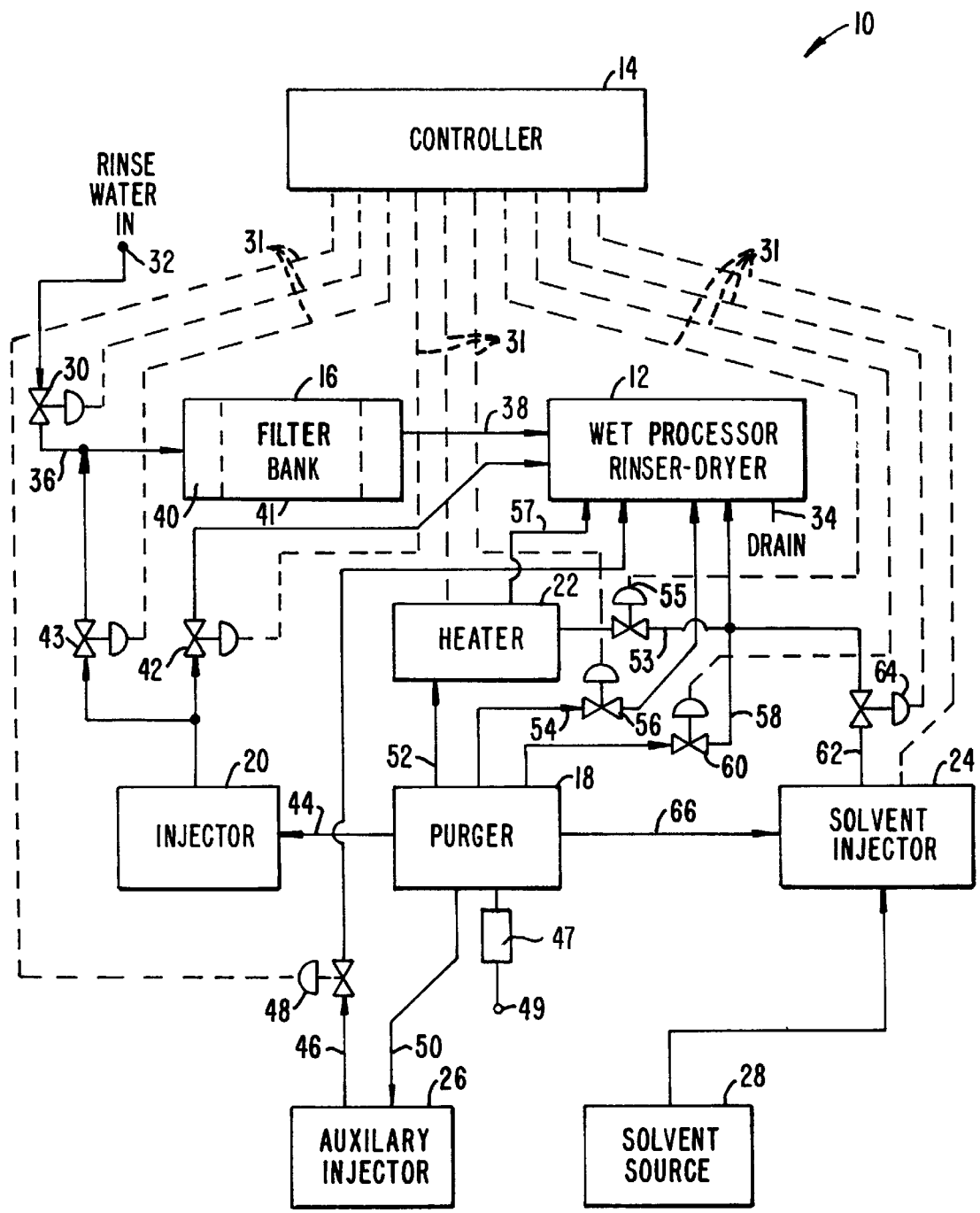
FIG. 1 is a simplified block diagram of an embodiment of the cleaning system according to the present invention.

FIG. 1 illustrates in block diagram form an embodiment of the cleaning system 10 according to the present invention. The cleaning system 10 includes elements such as a wet processor 12, a controller 14, a filter bank 16, a purger 18, an injector 20, a heater 22, a solvent bubbler 24, an auxiliary injector 26, and a solvent source 28. The system also includes a plurality of flow control valves 30. Each of the flow control valves is operably coupled to the controller 14 and at least one of the aforementioned elements, as shown by dashed lines 31. The solid lines represent lines used to transfer fluids between each of the system elements. A rinse water source 32 and drain 34 are also shown.

Rinse water enters the system at the rinse water source 32. A control valve at the rinse water source 32 controls the flow of rinse water via the controller 14, operably coupled to the control valve 30. The rinse water is a filtered liquid such as deionized (DI) water, among others. Typically the DI water originates from a DI water pad, often outside a wafer fabrication plant.

The filter bank can be any suitable combination of filters, typically used for point of use applications. The filter bank connects to the rinse water source through a line 36 and connects to the wet processor through a line 38. The filter bank includes an ion exchange module 40, a combination of charged and neutral filters 41, among others. This filter bank provides point of use ultra-purified water. The ultra-purified water is substantially free from particles greater than about 0.5 microns, and preferably greater than about 0.2 microns, and more preferably greater than about 0.1 microns.

Examples of charged filters are described and illustrated in application Ser. No. 08/285,316, filed Aug. 3, 1994, entitled METHOD AND APPARATUS FOR DELIVERING ULTRA-LOW PARTICLE COUNTS IN SEMICONDUCTOR MANUFACTURING (hereinafter "ULTRA-LOW PARTICLE COUNTS") assigned to the present assignee, and hereby incorporated by reference for all purposes. The filter bank provides for ultra-purified DI water with particles no greater than 0.5 microns in diameter, and preferably 0.2 microns in diameter and less and more preferably 0.1 microns in diameter and less.

The filter bank also provides for a nominal pressure drop therethrough. The pressure drop is less than about 15 pounds per square inch, and preferably less than about 5 pounds per square inch.

A higher flow rate is achieved through the filter bank without auxiliary pumps or flow/pressure enhancing devices. Of course, other filters capable of providing ultra-purified water for point of use applications can be used depending upon the application.

The injector 20 can be any suitable injector for reducing or preferably eliminating metal contaminants from lines and system elements. Preferably, the injector 20 is a hydrochloric acid injector. An example of an injector is discussed in ULTRA-LOW PARTICLE COUNTS. The injector connects to the wet processor 12. A control valve 42 meters the acid into the wet processor 12, and a control valve 43 meters the acid into the filter bank 16. Preferably, the controller 14 meters such acid into the system elements such as the wet processor 12 and the filter bank 16, among others during system maintenance, and other desirable times. The injector also connects via line 44 to the purger 18. The purger provides clean pressurized gas to the injector to allow such acid to be introduced into the aforementioned system elements without other auxiliary devices. Of course, the type of injector used depends upon the particular application.

A use of another chemical such as a solvent, hydrogen peroxide, surfactant, cleaning solution, or the like is optionally introduced through the auxiliary injector 26. The auxiliary injector connects to the wet processor through a line 46, and is controlled by a control valve 48 operably coupled to the controller 14. A purger supplying pressurized gas also connects to the auxiliary injector 26 through a line 50. An example of an auxiliary injector and its operation is also illustrated in the ULTRA-LOW PARTICLE COUNTS. Of course, the type of auxiliary injector used depends upon the particular application.

A further system element is the purger 18, often used to supply gas and/or a pressure head to certain system elements such as the wet processor and others. The purger can be any suitable type of pressure reduction and/or control means capable of supplying the source gas to certain system elements at the desired pressure and flow rate. The purger connects to a source gas 49, which is often a carrier gas used in the cleaning system.

Purger 49 also couples to filter 47 before the gas source. This filter 47 is capable of high flow rates, e.g., 1500 standard liters/minute and greater. Filter 47 also has a retention rating at 0.003 microns. Preferably, no less than about 99.9999999% of particles are removed by way of filter 47. The filter 47 is coupled between the facilities and cleaning system 10. The filter 47 is located before or immediately before the cleaning system 10. In one embodiment, the filter 47 is attached to the cleaning system, but also can be at other locations. This filter provides for a substantially particle free environment. That is, the gas is substantially free from particles greater than about 0.2 microns, or greater than about 0.1 microns, or greater than about 0.05 microns, or greater than about 0.025 microns, or more preferably greater than about 0.01 microns and less. An example of such a filter is product made by Wafergard T-Line Cartridge Filters. Of course, other filters can be used depending upon the application.

Preferably, the carrier gas is an ultra-purified or electronic grade nitrogen gas, or any suitable carrier gas capable of carrying a cleaning enhancement substance (e.g., a trace of polar organic compound, etc.) into the wet processor at a desired temperature, pressure, and flow rate. The suitable carrier gas also includes a high purity level to prevent contamination of the system elements. An example of a purger is illustrated in ULTRA-LOW PARTICLE COUNTS. The carrier gases (or gas) is also ultra-clean or substantially free from particles greater than about 0.1 microns and preferably greater than about 0.05 microns. As previously noted, the purger also supplies pressurized carrier gas to the bubbler 20 and auxiliary injector 26 through lines 44 and 50, respectively. The purger further supplies gas to the wet processor through certain alternative routes.

A typical route connects the purger 18 to the wet processor 12 through the heater 22 via lines 52 and 57. In this route, the gas can be heated at the heater 22 before entering into the wet processor 12 through the line 57. The heater can be any suitable commercially available or custom made heater capable of heating the gas such as nitrogen to a temperature at the wet processor 12 greater than 70° F. and preferably greater than 150° F., but no greater than 200° F. The controller is operably coupled to the heater to adjust the temperature of the gas and turn-on and turn-off the gas at the desired times. Preferably, however, the gas is at room temperature, and is not heated. The controller also meters the gas into the wet processor at a desired flow rate and time.

Alternatively, the heated gas (a carrier gas) connects to the solvent bubbler 24 through a line 53, before entering the wet processor 12. The heated carrier gas mixes and dilutes solvent from the solvent bubbler 24 before entering the wet processor 12. The controller 14 is operably coupled to a control valve 55 to meter the heated carrier gas to the wet processor 12.

Another alternative route connects the purger 18 directly to the wet processor 12 through a line 54. The controller 14 is operably coupled to a control valve 56 to turn-on and turn-off the gas at the desired times. The controller 14 and the control valve 56 also meter the gas into the wet processor 12 at a desired flow rate and time.

In a further alternative route, the purger 18 connects to the solvent bubbler 24 through a line 58 before entering the wet processor 12. In this route, the carrier gas mixes with solvent (a cleaning enhancement substance) from the solvent bubbler 24 before entering the wet processor 12. The controller is operably coupled to a control valve 60 that meters the carrier gas to the wet processor through the line 58. In one embodiment, the carrier gas contains a trace of polar organic solvent. This carrier gas contains a cleaning enhancement substance which increases fluid flow and cleans off objects to be cleaned. Of course, the use of any of these configurations or combinations of such configurations depends upon the particular application.

The controller 14 can be any suitable microprocessor based programmable logic controller, personal computer controller, or the like for process control. A suitable controller includes features such as programmability, reliability, flexibility, and durability from corrosive elements. The suitable controller includes various input/output ports used to provide connections to open and close valves, regulate and meter fluids, among other features. The controller also includes sufficient memory to store process recipes for desired applications. An example of a suitable controller is illustrated in the ULTRA-LOW PARTICLE COUNTS. Of course, the type of controller used depends upon the particular application.

The solvent bubbler 24 supplies a carrier gas comprising a trace amount of polar organic compound (a cleaning enhancement substance) to the wet processor 12 through line 62. Preferably, the cleaning enhancement substance is a trace of solvent. The purger 18 supplies the carrier gas to the solvent bubbler through line 66. To regulate or meter the flow of the solvent into the wet processor, the controller operably couples a control valve 64 connected to the line 66, attached to the solvent bubbler. The system also provides the solvent source 28 such as a bottle or canister of the desired chemical.

Figure 2:
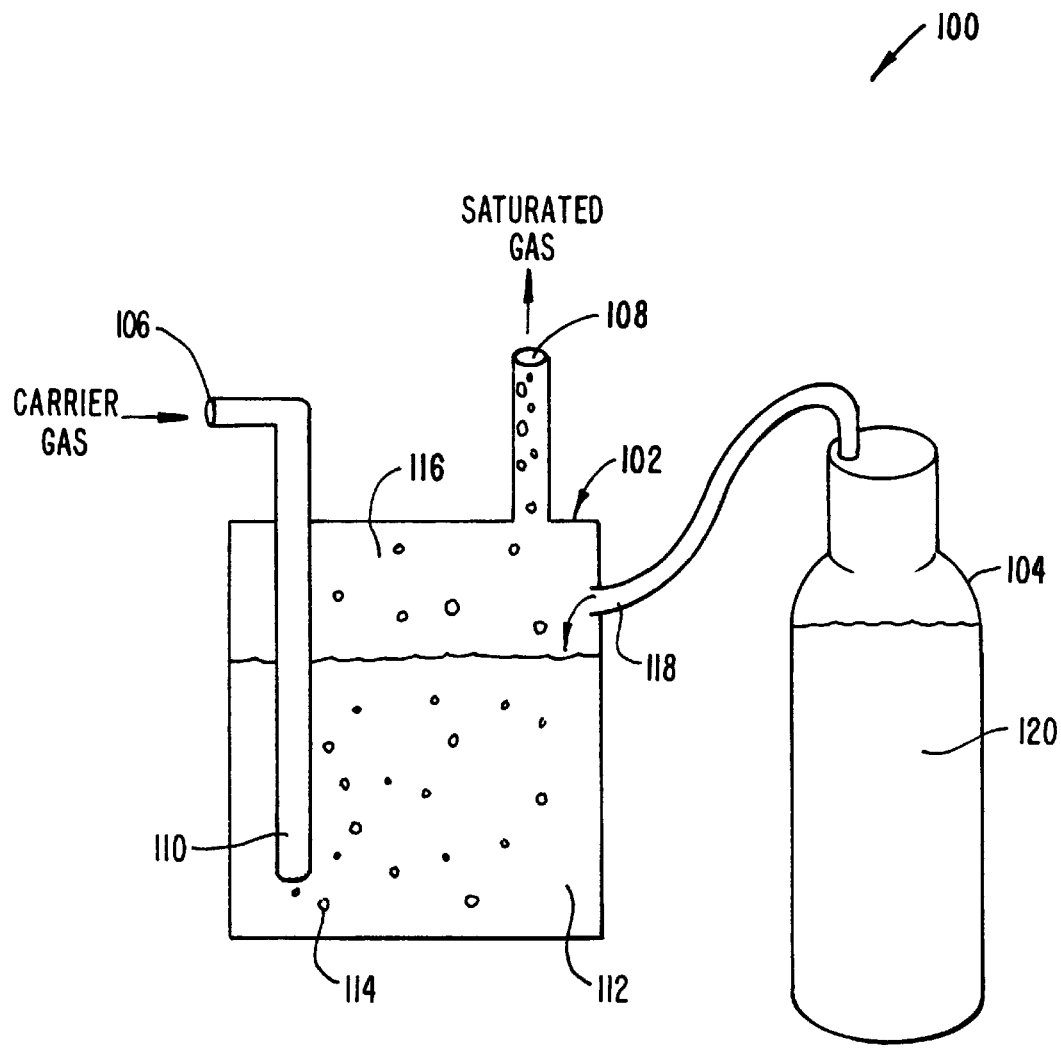
FIG. 2 is a simplified cross-sectional view of a solvent bubbler according to the present invention.

The solvent bubbler can be any suitable solvent bubbler system for use with the wet processor, carrier gas, and solvent. An example of a solvent bubbler system is represented by the simplified illustration of FIG. 2. The solvent bubbler system 100 includes a solvent bubbler vessel 102 and a solvent source 104. The solvent bubbler vessel 102 connects to a carrier gas source at an inlet 106. A sparger 110 sparges carrier gas 114 as bubbles into the solvent 112 at a lower portion of the solvent bubbler vessel. As the carrier gas bubbles float up through the solvent, the carrier gas bubbles accumulate with solvent. Carrier gas bubbles with solvent escape into the vapor head space 116 of the solvent bubbler vessel 102, and exit the solvent bubbler vessel through outlet line 108. This carrier gas with solvent generally behaves according to ideal gas laws or the like. A solvent fill inlet 118 also is connected to the solvent bubbler vessel 102. A solvent source 104 and solvent 120 are further shown. Alternatively, the solvent can be introduced into the carrier gas by mechanical means, e.g., ultrasonic, megasonic, mister, etc.

Figure 3:
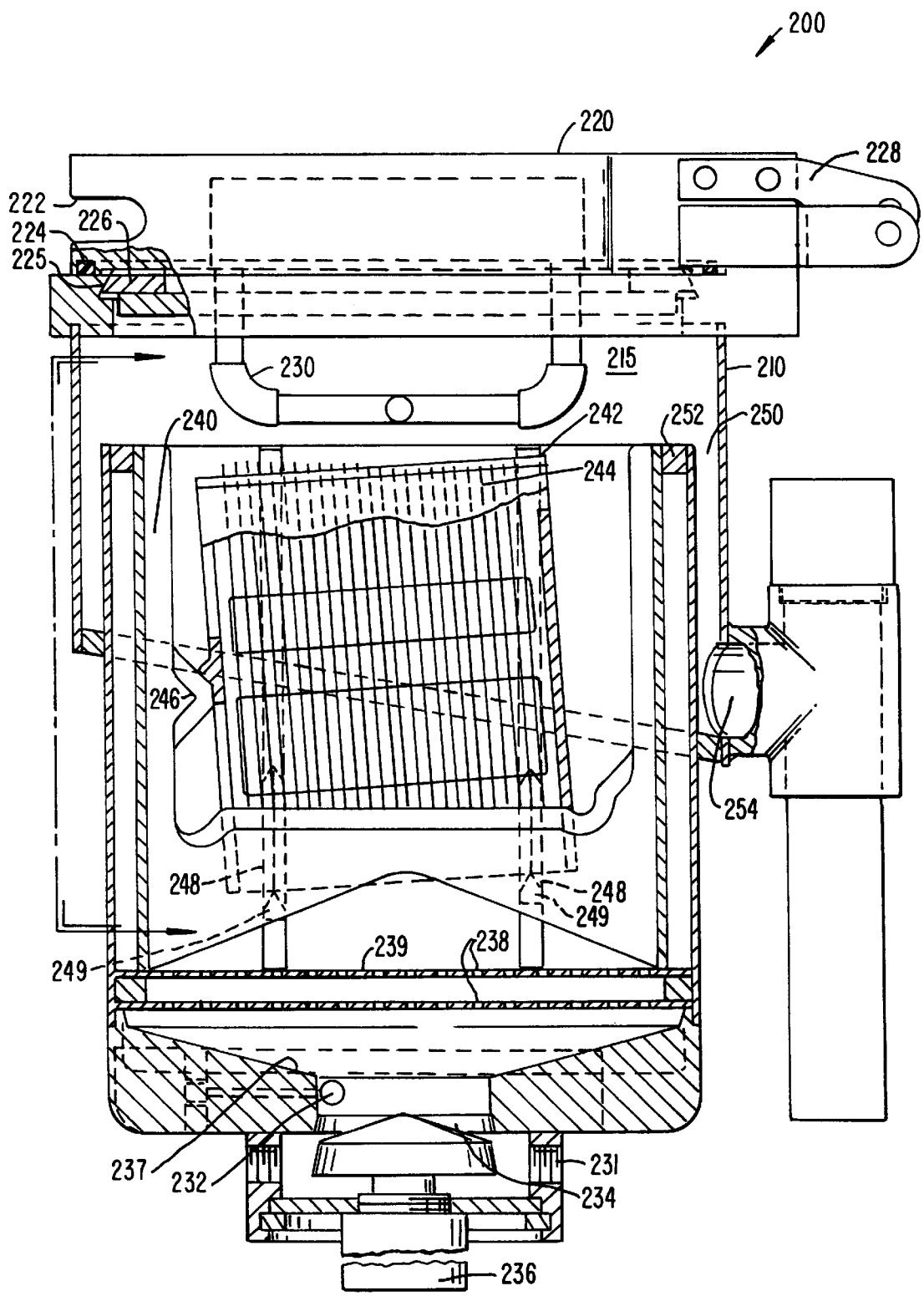
FIG. 3 is a simplified cross-sectional side-view of an embodiment of the cleaning chamber.

FIG. 3 is a simplified cross-sectional side-view 200 embodiment of the cleaning chamber according to the present invention. The side-view embodiment 200 includes a main chamber 210, a lid 220, a lower drain region 231, and other elements. The main chamber 210 includes the process region 240 (or lower chamber region) and upper chamber region 215. A cascade drain region 250 also is shown. Of course, other chamber elements also may be present depending upon the particular application.

The lid 220 is preferably a sealed lid. The sealed lid includes a handle 222, O-ring type seal 224, a compression ring 226, a hinge 228, a gas inlet 230, among other features. The compression ring 226 provides outward force onto a horizontal portion 225 of the main chamber housing to seal the contents of the main chamber. The O-ring type seal 224 provides a horizontal seal between vertical surfaces of the lid and main chamber housing. The gas inlet 230 includes at least a carrier gas inlet and solvent gas inlet. Of course, the exact configuration of the gas inlet depends upon the particular application.

The process region 240 includes a substrate carrier 242, substrate carrier support 246, 248, and substrate support 249. As will be described in greater detail below, the substrate carrier and substrate support are configured and arranged to minimize liquid accumulation as liquid is drained away in the drying process.

In a specific embodiment, the substrate carrier is a wafer boat or alternatively a half wafer boat or any other type of substrate carrier with a lower profile. The half wafer boat or lower profile boat holds or accumulates less liquid than its full boat counterpart, and therefore drains liquid faster and more easily. The carrier includes substrates (e.g., wafers) 244 disposed within the supports of the carrier. The carrier is supported by a side substrate carrier support 246 and bottom substrate carrier support 248. The side substrate carrier support holds the substrate carrier in place, and prevents such substrate carrier from excessive movement. As shown, the bottom substrate support tilts the substrate carrier in a slight angle from a horizontal position. The angle tends to prevent substrates from sticking to each other during certain rinse and dry operations. The angle from the horizontal position ranges from about 2° to about 15°, and is preferably determined by the characteristics of the particular carrier. By keeping each of the substrates separated, liquid does not accumulate therebetween, thereby decreasing the amount of liquid and therefore particles from accumulating on the substrate.

Each substrate carrier support includes a contact point on the substrate carrier to drain liquid such as water from the substrate carrier surface. The contact point is typically a knife edge, serrated edge, or any other shape that breaks the surface tension of the liquid on the substrate carrier surface. By breaking the surface tension of the liquid on the substrate carrier, the liquid with particles drains (or "wicks") off of the substrate carrier more easily. Removing the liquid with particles from the substrate carrier tends to promote drying and rinsing of each of the substrates in a particle free manner.

The substrate support 249 provides lift and a contact point to each of the substrates 244 within the substrate carrier. To more easily appreciate the features of the substrate support, it should be noted that each of the substrates in a conventional substrate carrier touches the substrate carrier in at least three large regions. Each of the substrates is also relatively close to the insides of the substrate carrier. Accordingly, liquid easily accumulates and is often trapped on edges of each of the substrates.

To reduce this effect, the substrate support lifts the substrates in the substrate carrier by elevating each of the substrates in the carrier with a knife edge. By lifting each of the substrates in the substrate carrier, the substrate edges are further away from insides of the carrier, thereby allowing liquid to flow free from the region between the substrate edges and carrier insides. To further promote the removal of liquid from each of the substrates, the knife edge is preferably pointed, serrated, or any other shape that easily breaks the surface tension of the liquid at the bottom of each substrate. By breaking the surface tension of liquid at the substrate bottom edges, liquid flows free from the substrate bottom edges, thereby reducing the meniscus at such edges. The knife edge lifts each of the substrates at least 2 mm from the bottom insides of the carrier, and preferably lifts each of the substrates about 5 mm, but no more than about 20 mm. The substrate carrier support removes liquid such as water from the substrates, thereby decreasing the amount of water and in particular the particles in the water.

To add and drain liquid into the main chamber, and in particular the process region, the lower drain region 231 includes a fill inlet 232 and drain valve 236. The fill inlet provides liquid such as DI water and the like into the process region. The drain valve 236 removes liquid from the process region through the drain outlet 236. A plurality of drain holes 238 also exist at the bottom of the main chamber in the process region to distribute the liquid evenly therethrough. The lower drain region also includes an angled drain floor 237 at the bottom of the main chamber to facilitate liquid transfer, and a flat support surface 239 in the process region to support the substrate carrier support.

A cascade region 250 allows liquid to cascade out into cascade drain region 253. To rinse certain chemicals from the substrate carrier and substrates, ultra-purified DI water enters through the fill inlet 237, rises through the drain holes 238, flows through the process region 240, and cascades over a partition 252 into the cascade drain region 253. This sequence of steps removes excess chemicals such as acids or the like from the substrate carrier and substrates, and also keeps such chemicals from accumulating in the main chamber and in particular the process region.

Figure 4:
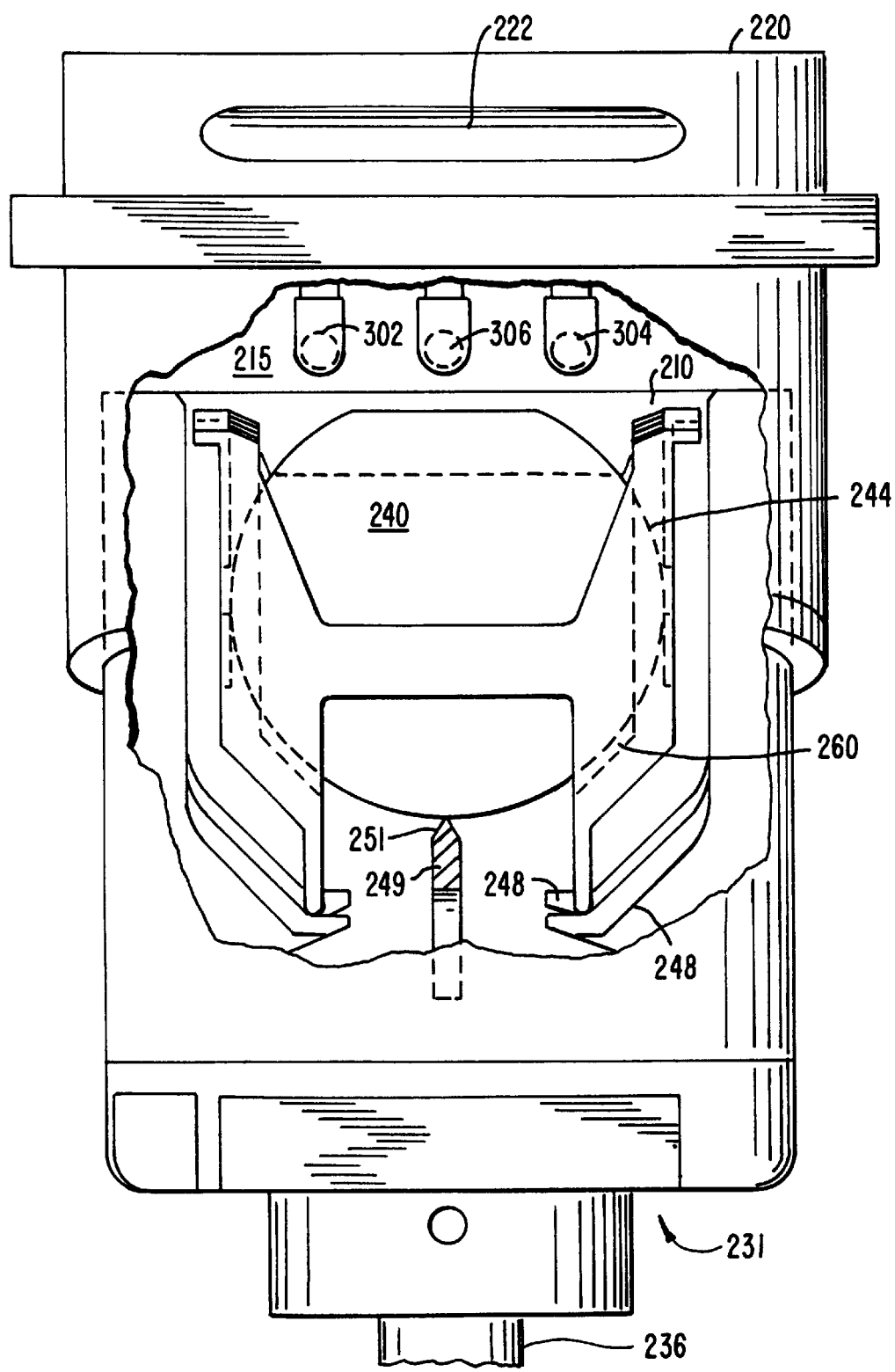
FIG. 4 is a simplified cross-sectional front-view of an embodiment of the cleaning chamber.

FIG. 4 illustrates a simplified front view of the cleaning chamber according to the present invention. For easy reading, FIG. 4 uses some of the same reference numerals as the FIG. 3 embodiment. The front-view embodiment shows elements such as the main chamber 210, the lid 220, the lower drain region 231, the process region 240, among others. The main chamber 210 includes the process region 240 and upper chamber region 215.

As shown, the substrate support 249 lifts each of the substrates from the substrate carrier to form a gap 260 between substrate edges and substrate carrier insides. The gap prevents liquid from accumulating between such substrate edges and substrate carrier insides. The gap is no greater than about 20 mm, but is larger than about 2 mm. The substrate support is a knife edge with triangular point 251. Other shapes may also be used to break the meniscus at the bottom of the substrate edges and remove water therefrom. The meniscus often forms at the bottom substrate and surface edges as liquid is being removed from the substrates. As previously noted, the meniscus often contains particles, often detrimental to the manufacture of an integrated circuit.

The front view also shows the substrate carrier supports 248. As shown, each of the substrate carrier support is arranged with different heights, typically lower to higher from one side of the process region to the other side of the process region. The different heights of the substrate carrier support tilt the position of the substrate carrier from horizontal. The tilt or angle of the substrate carrier also tilts the substrates, thereby preventing such substrates from sticking to each other during certain rinse and dry operations.

The front view further shows certain gas inlets 302, 304, and 306. Each of the gas inlets is a distribution plenum with a plurality of holes for distributing gas evenly over the process region. The embodiment includes two outside gas inlets 302 and 304, and a center carrier gas inlet 306. The two outside gas 302, 304 inlets generally introduce an ultra-pure non-reactive (e.g., non-oxidizing, non-reactive, inert, etc.) gas into the cleaning chamber. In some embodiments, the two outside gas inlets provide ultra-pure nitrogen to purge the main chamber from the environment, thereby creating an ultra-clean main process region, e.g., substantially free from particles. In these embodiments, the nitrogen gas (or absence of oxygen gas) is necessary or even critical to prevent the formation of oxidation on the substrate, e.g., semiconductor wafer, etc. The center gas inlet introduces the carrier gas comprising the cleaning enhancement substance. The non-reactive gas (or nitrogen) mixes with the carrier gas comprising cleaning enhancement substance in the cleaning chamber. By way of the ultra-pure non-reactive gas and carrier gas, the chamber is substantially free from particles greater than about 0.2 microns, and is preferably substantially free from particles greater than about 0.1 microns, thereby creating an ultra-pure and ultra-clean environment. Of course, the number of inlets and their use depend upon the particular application.

Figure 5:
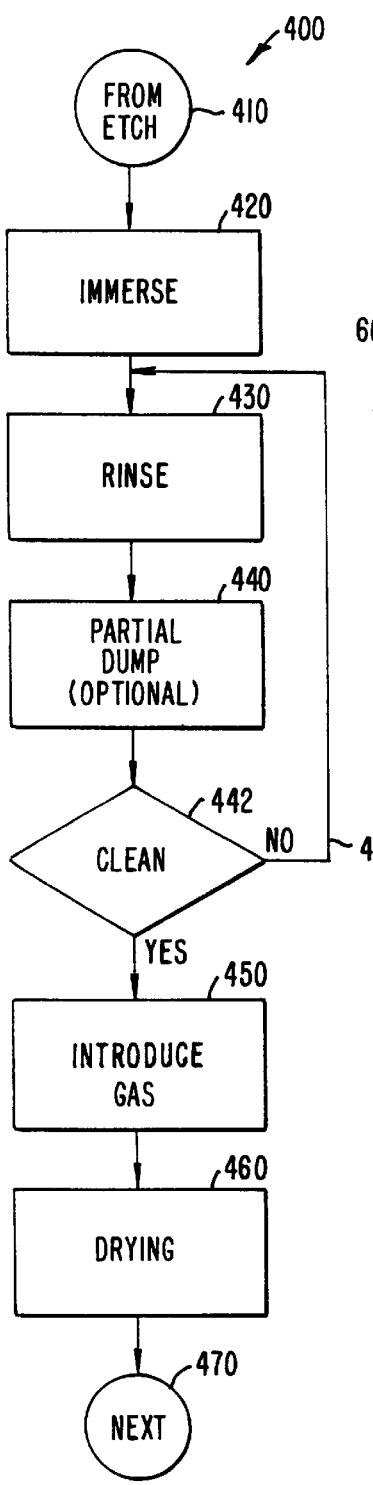
FIG. 5 is a simplified flow diagram of an embodiment of the cleaning method according to the present invention.

FIG. 5 is a simplified flow diagram 400 of an embodiment of a cleaning method according to the present invention. The rinse method is illustrated as a cleaning method for a recently wet etched substrate. The wet etched substrate for illustrative purposes is etched in a solution of hydrofluoric acid (HF) or buffered hydrofluoric acid (BHF). Hydrofluoric acid is often used to remove oxides from surfaces of a semiconductor wafer. As merely an example, this embodiment should not be taken as limiting the scope of the present invention.

The flow diagram begins 400 by receiving a recently etched substrate (etched wafer) 410 from the BHF etch. The etched substrate has no oxide layer thereon from the BHF etch, and is predominately hydrophobic in characteristic. A step 420 of immersing the etched substrate in the bath of ultra-purified DI water follows. The etched substrate is immersed into the DI water from the acid bath in about 5.0 seconds or less, and preferably about 2.5 seconds and less.

The step of immersing the etched substrate immediately into the DI water substantially prevents formation of silicon dioxide from the oxygen in air, and promotes the formation of a thin but clean high grade silicon dioxide layer from the ultra-purified DI water. The DI water is substantially free from particles and therefore forms a substantially particle free silicon dioxide layer. The DI water can be at room temperature (e.g., 20° C.) or an elevated temperature, e.g., 25° C., 30° C., 40° C., 45° C., etc.

To remove acid such as the HF from the surface of the substrate, the ultra-purified DI water in the main chamber (or vessel) flows across the substrate and cascades over into a drain. The DI water cascade carries excess acid into the drain and reduces the acid concentration in the vessel.

Optionally, the DI water in the vessel may be removed by dumping it (step 440) into a bottom drain dump. Preferably, the dumping step is a partial dump, and not a complete dump or removal of DI water. During the removal of the DI water, an ultra-pure gas (non-reactive) replaces the DI water. A typical gas includes filtered nitrogen and others. The filtered gas also is ultra-clean, e.g., substantially free from particles.

After replacing the DI water with the clean gas, clean DI water from the DI water source flows into the main chamber to cover the surface area of the substrate. These aforementioned steps may be repeated (branch 445) alone or in any combination until substantially no residual acid exists (test 442) on the substrate.

When residual acid has been substantially removed from the substrate, a carrier gas, including a cleaning enhancement substance (e.g., trace amount of polar organic compound, helium, carbon dioxide, etc.), is introduced (step 450), and mixes with ultra-pure non-reactive gas and replaces the DI water. In one embodiment, the trace of polar organic compound in the gases includes a concentration ranging from about 1,000 ppm and less to about 500 ppm and less. The polar organic compound also can be at other concentrations, but is generally not saturated or superheated. The carrier gas is preferably ultra-pure nitrogen with a trace of polar organic compound such as isopropyl alcohol, di-acetone alcohol, 1-methoxy-2-propanol, and others. The carrier gas is also substantially free from particles of about 0.20 microns to about 0.15 microns, and is preferably free from particles of about 0.10 microns or less. For a typical batch of substrates in a conventional substrate boat, the amount of polar organic organic compound used is preferably less than a milliliter.

The trace of polar organic compound is made by bubbling carrier gas into a liquid solution of polar organic compound. In particular, the polar organic compound is made by flowing cold or hot nitrogen through a solution of polar organic compound at a rate of about 3 cubic feet/min. or less. The carrier gas comprising the polar organic compound then mixes with either cold nitrogen at a flow rate of about 5 cubic feet/min. and less, or hot nitrogen at a flow rate of about 10 cubic feet/min. and less. A temperature of such hot nitrogen carrier gas is at about 70° F. and higher but not greater than 250° F., and is preferably about 185° F. and less. By mixing nitrogen gas with the carrier gas comprising the polar organic compound, the polar organic compound is substantially dilute (or a non-saturated vapor) in the main chamber.

The mixed carrier gas, including the polar organic compound and non-reactive gas, comes in contact with the attached DI water on the wafer, which is being drained off at a slow rate. This tends to remove particles from such substrate. A carrier gas, including isopropyl alcohol, 1-methoxy-2-propanol, di-acetone alcohol, or other polar organic solvents mixed with non-reactive gas, replaces the DI water at a rate of about 4 mm/second or less as measured from the substrate face, and is preferably at a rate of about 1 mm/second and less.

The trace of polar organic compound is believed to remove a substantial portion of the liquid on the substrate surface through a concentration gradient or mass transfer effect, e.g., Marongoni flow. This effect tends to increase the flow of liquid from the substrate surface through use of a solvent or any cleaning enhancement substance., but does not remove all liquid from the substrate surface. It is generally believed that the trace of polar organic compound in the gas changes the angle of the liquid meniscus on the substrate face to reduce surface tension of the liquid attached to the substrate face, thereby increasing fluid flow therefrom. It is also generally believed that the trace amount of the polar organic compound dopes the liquid attached to the substrate face to cause a concentration gradient of the polar organic compound in the attached liquid to accelerate fluid flow of the attached liquid off of the substrate face. In particular, the polar organic compound forms a concentration gradient along a boundary layer of liquid attached to the substrate surface, which facilitates the fluid flow therefrom. This fluid flow pulls or draws off any particles from the substrate face. These particles are less than about 0.5 microns in diameter or preferably 0.2 microns in diameter or more preferably 0.1 microns in diameter. Preferably, the carrier gas also is not heated but is at room temperature, e.g., 18 to 22.5° C.

In certain embodiments, a thin boundary layer of liquid still remains on the substrate face after liquid is removed from the chamber. This boundary layer often ranges from about 1,000 Å and less and is preferably 500 to about 50 Å, and is more preferably at about 100 Å and less. In one embodiment using isopropyl alcohol as the polar organic compound, the boundary layer is about 500 Å and less. In an embodiment using 1-methoxy-2-propanol, the boundary layer is about 100 Å and less. A further drying step can be used to evaporate such boundary layer.

In alternative embodiments, the gas (i.e., ultra-pure gas) is substantially free from any polar organic compounds, organic compounds, or the like. Like the previous embodiments, the gas replaces the DI water (step 450) being drained, removing water from the surface of the substrate, and also tends remove particles from such substrate via the DI water. The gas replaces the DI water at a rate of about 2.50 mm/second or less as measured from the substrate face, and is preferably at a rate of about 1.25 mm/second and less, and is more preferably at a rate of about 0.60 mm/second or less. In such embodiments, the present invention uses substantially no harmful solvents or the like, and is therefore even more safe, efficient, and economical.

A step of drying (step 460) is performed on the substrate and carrier for further drying, if necessary. The step of drying substantially removes all liquid droplets adhering to surfaces such as substrate edges, carrier edges, and the like. In one embodiment, drying occurs by pulse flow drying. The step of pulse flow drying occurs by way of high velocity flow apparatus 600 illustrated in FIGS. 6, 6A, and 6B. The high velocity flow apparatus can be adapted into the present rinse chamber 200 among other systems. The high velocity flow apparatus includes a plurality of nozzles 601 directed over a substrate carrier 242. The substrate carrier 242 includes a plurality of substrates 244, each having residual amounts of liquid at their edges. Each substrate may have a liquid volume ranging from about 1.0 milliliter to about 0.2 milliliter but is preferably less than about 0.5 milliliter. The plurality of nozzles 601 is defined by a first set of nozzles 603 (first nozzle set), a second set of nozzles 605 (second nozzle set), and others.

The first nozzle set 603 is directed to the front side 607 of the substrates 244. The first nozzle set directs drying fluid at substrate edges 609 adjacent to the substrate carrier sides 246. The drying fluid can be any suitable fluid capable of removing liquid from the substrate edges and substrate surfaces. The drying fluid is preferably ultra-pure nitrogen and the like, but may also be a variety of other gases or gaseous mixtures. The first nozzle set preferably includes at least two nozzles, each placed at a location to direct drying fluid towards the substrate edges 609 adjacent to the substrate carrier sides. In the first nozzle set, a first nozzle A1 611 is directed to the substrate edges 609 at one side of the substrate carrier, and a second nozzle A2 615 is directed to the substrate edges 609 at the other side of the substrate carrier.

The second nozzle set 605 is directed to the back side 619 of the substrates 244. The second nozzle set directs drying fluid at substrate edges 609 adjacent to the substrate carrier sides 246. The second nozzle set preferably includes at least two nozzles, each placed at a location to direct drying fluid towards the substrate edges adjacent to the substrate carrier sides. In the second nozzle set, a first nozzle B1 621 is directed to the substrate edges at one side of the substrate carrier, and a second nozzle B2 625 is directed to the substrate edges at the other side of the substrate carrier.

Figure 6:
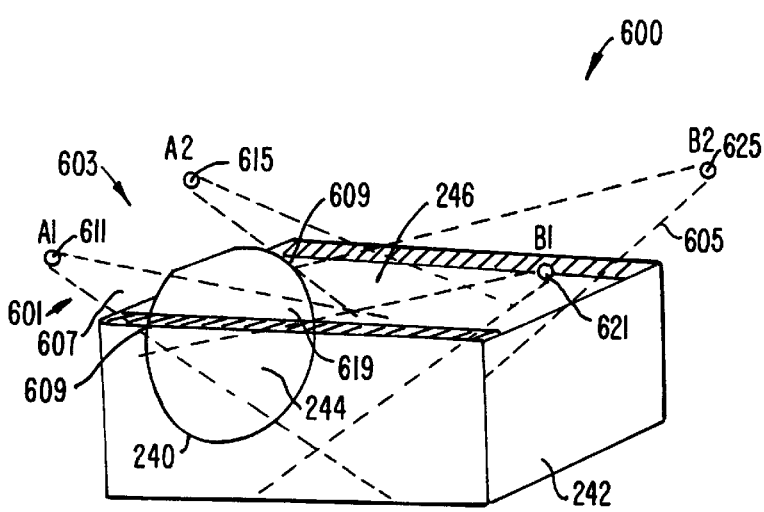
FIG. 6 is a simplified diagram of a high velocity flow apparatus according to the present invention.
Figure 7:
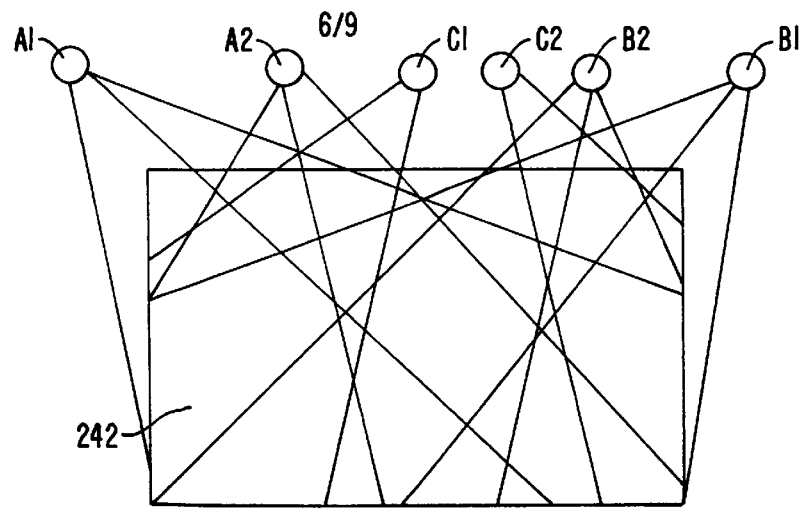
FIGS. 7 and 8 are simplified fluid flow diagrams of the high velocity flow apparatus of FIG. 6.
Figure 8:
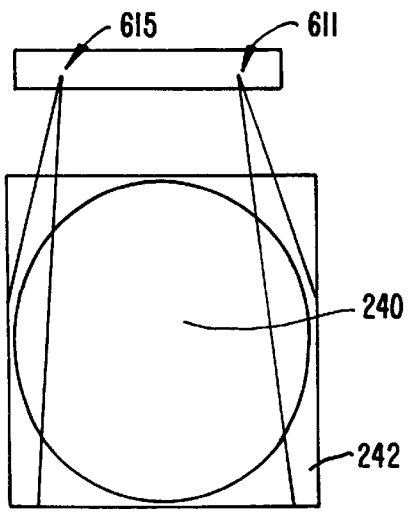

The nozzle can be any suitable nozzle capable of enabling the drying fluid to flow over the substrate edges and remove liquid therefrom as illustrated by fluid flow distribution patterns in FIGS. 7 and 8. FIG. 7 illustrates a simplified side-view diagram of the apparatus of FIG. 6 according to the present invention. As shown, nozzles A1, A2, B2, and B3 direct drying fluid at the substrate edges (not shown) to preferably cover the inner surface area of the substrate carrier 242. Optionally, the apparatus can also include additional nozzles C1 and C2. Nozzles C1 and C2 are directed toward the substrate carrier front and back sides.

Figure 6A:
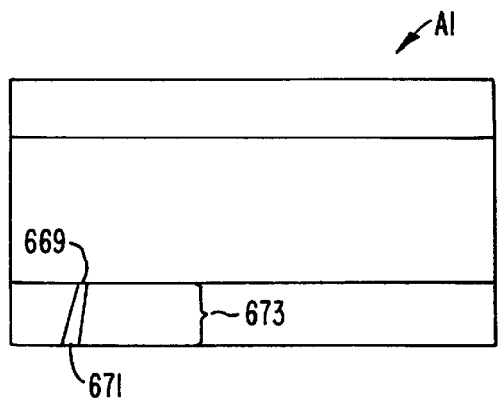
FIGS. 6A and 6B illustrate simplified diagrams of a nozzle according to the present invention.
Figure 6B:
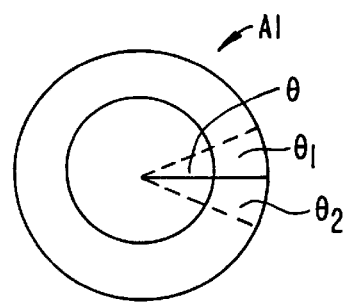

FIG. 8 illustrates a simplified front-view diagram of the nozzles A1 and A2 for the apparatus of FIG. 6 according to the present invention. Nozzles A1 and A2 direct drying fluid at the substrate edges along a front portion of the substrates. The nozzle is preferably narrow and long to produce a fluid flow at high velocity to cover the desired number of substrates. Each nozzle produces a fluid flow of, for example, nitrogen gas ranging from about 250 to about 350 standard cubic feet per hour, and is preferably about 300 standard cubic feet per hour. The pressure of the nitrogen gas at the nozzle opening ranges from about 80 to about 90 psia, and is preferably about 85 psia. A nozzle A1 also includes an opening 669 having a width of about 0.025 inch and a height of about 0.375 inch 673 as illustrated in FIGS. 6A and 6B. As shown, FIG. 6A illustrates a simplified cross-sectional side view of the nozzle, and FIG. 6B illustrates a simplified cross-sectional front view of the nozzle. The nozzle opening 671 includes an angle θ ranging from about 20 degrees to about 80 degrees, but is preferably about 75 degrees and less. The angle θ may also be defined by a first angle $\theta_1$ and second angle $\theta_2$. The first angle may be different from the second angle but can also be the same. Of course, other flow rates, pressures, and nozzle dimensions can be used depending upon the particular application.

Each nozzle is positioned to direct drying fluid to the substrate edges and portions of the substrate surface. The nozzle is directed to an inner edge of the substrate carrier to promote the removal of liquid between the substrate edges and the carrier sides. The nozzle is defined between about 0.5 inch to about 2 inches from an outside edge of the substrate carrier. The nozzle is placed at an angle from about 5° to about 85°, and is preferably about 45° from a line perpendicular from the substrate surface. Of course, the exact angle used depends upon the particular application.

Drying occurs by directing drying fluid from the first nozzle set and the second nozzle set in an alternating sequence against the substrate edges and portions of the substrate surfaces. For example, the first nozzle set sends a pulse of drying fluid against the substrate edges and portions of the front substrate surfaces, then the second nozzle set sends a pulse of drying fluid from the opposite direction against the substrate edges and portions of the back substrate surface. The drying fluid pulses from the first nozzle set and the second nozzle set alternate until no more liquid remains on the substrate edges.

In removing water from the substrate edges, the second nozzle set has a pulse duration which is longer than the pulse duration of the first nozzle set. Water adheres on the back-side of the substrate and substrate edges on a conventional semiconductor wafer with a greater attractive force than the front-side of the substrate. Accordingly, it is often preferable to have a pulse duration at the second nozzle set which is at least two times longer than the pulse duration at the first nozzle set. The pulse duration at the second nozzle set can also be three times longer or more than the pulse duration at the first nozzle set. The pulse duration for the first nozzle set ranges from about 1 to 3 seconds and greater, and the pulse duration for the second nozzle set ranges from about 2 to 6 seconds and greater. The number of pulses is preferably greater than 5 for each substrate side for a total of about 30 seconds of total pulsing time. Of course, other selected pulses among the first and second nozzle sets may also be performed, depending upon the particular application.

Optionally, pulse flow drying is followed by flowing hot nitrogen gas over the substrate carrier (step 470). The hot nitrogen gas is ultra-pure nitrogen gas with a temperature at about 70° F. and is preferably greater than 150° F., but no greater than 200° F. The combination of hot nitrogen and pulse flow drying reduces actual drying time by about one half, as compared to drying solely by means of hot nitrogen and the like. Alternatively, a drying gas such as nitrogen can be used alone to dry the wafer. Of course, other carrier gases and combinations thereof may also be used depending upon the particular application.

Figure 9:
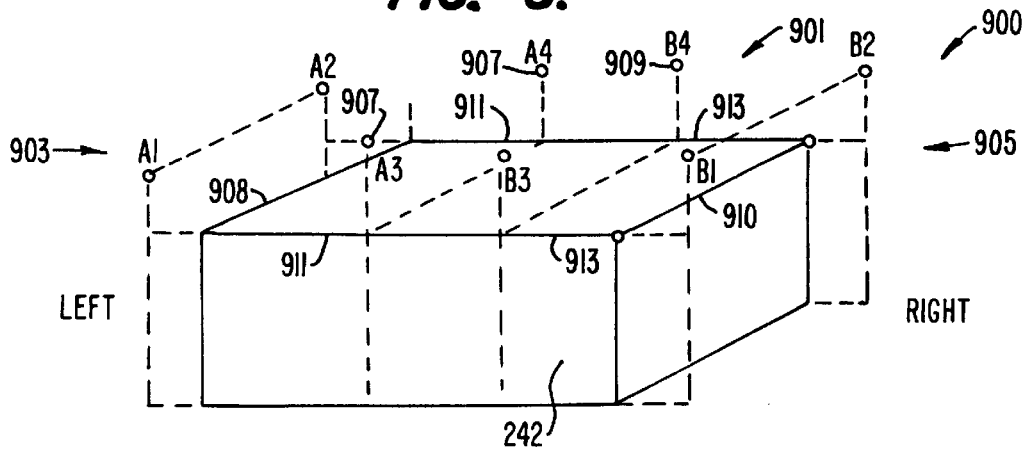
FIG. 9 is a simplified diagram of an alternative embodiment of the high velocity flow apparatus according to the present invention.

FIG. 9 is a simplified diagram of an alternative embodiment of the high velocity flow apparatus 900 according to the present invention. The high velocity flow apparatus includes a plurality of nozzles 901 directed over a substrate carrier 242. The substrate carrier 242 includes a plurality of substrates 244 (not shown), each having residual amounts of liquid at their edges. Each substrate may have a liquid volume ranging from about 1.0 milliliter to about 0.2 milliliter but is preferably less than about 0.375 milliliter. The plurality of nozzles 901 is defined by a first set of nozzles 903 (first nozzle set), a second set of nozzles 905 (second nozzle set), a third set of nozzles 907 (third nozzle set), a fourth set of nozzles 909 (fourth nozzle set), and others.

The nozzles are placed at selected locations surrounding the substrate carrier, and in particular the substrates disposed in the substrate carrier. The first nozzle set A1, A2 is placed at an end 908 of the substrate carrier facing the substrate faces, and the second nozzle set B1, B2, is placed at the other end 910 of the substrate carrier facing the back-side of the substrates. The third nozzle set includes nozzles A3, A4 which face each other and are disposed adjacent to a first portion 911 of the substrate carrier edges. The fourth nozzle set includes nozzles B3, B4 also face each other and are disposed adjacent to a second portion 913 of the substrate carrier edges. The design of each nozzle is similar to the previous embodiment, but each nozzle covers less area than the previous embodiment.

In removing residual water from the substrates, each set of nozzles is pulsed in a selected pattern. For example, the pulse pattern begins by pulsing drying fluid at nozzles A1, A2 followed by nozzles A3, A4 followed by nozzles B1, B2 followed by nozzles B3, B4, and the sequence repeats as often as it is necessary to remove substantially all water from the substrate. Alternatively, the pulse pattern begins at nozzles B3, B4 followed by nozzles B1, B2 followed by nozzles A3, A4 followed by nozzles A1, A2, and the sequence then repeats as often as it is necessary to remove substantially all water from the substrate.

Optionally, the pulse drying is followed by flowing hot nitrogen gas over the substrate carrier. The hot nitrogen gas is ultra-pure nitrogen gas with a temperature at about 70° F. and is preferably greater than 150° F., but no greater than 200° F. The hot nitrogen gas flows over the substrates for a period of time of at least 30 seconds and more, or preferably 50 seconds and more. The combination of hot nitrogen and pulse drying reduces actual drying time by about one half, as compared to drying solely by means of hot nitrogen and the like. The pulse drying step removes or evaporates liquid from the boundry layer. Pulse drying also removes or evaporates liquid on edges of the substrate. Alternatively, hot nitrogen gas alone can be used to dry the wafer. Of course, other carrier gases and combinations thereof may also be used depending upon the particular application.

Another method to rinse and dry HF etched substrate includes a selected sequence of the aforementioned steps. A solution of HF etches silicon dioxide off the semiconductor substrate. To stop etching, the substrate is quickly immersed into ultra-pure DI water in a vessel. After immersing the etched substrate into the DI water, the vessel is purged with filtered nitrogen gas. The nitrogen gas flows at a rate of ranging from about 1 cubic feet/min. to about 10 cubic feet/min., and is preferably at about 2 cubic feet/min.

To further rinse and remove acid from the substrate, DI water flows past the substrate and cascades from a top portion of the vessel into a drain to cascade rinse the substrate. A quick dump follows the cascade rinse. Preferably, the quick dump occurs at a rate where the liquid level drops at a rate greater than about 20 mm/sec. as measured from a substrate face. During the quick dump, clean nitrogen gas replaces the DI water, thereby preventing any oxidation of the substrate from air. Clean DI water fills the vessel and replaces the nitrogen to re-immerse the substrate in the DI water.

A combination of a carrier gas, including a cleaning enhancement substance, mixed with ultra-pure non-reactive gas then slowly replaces the DI water to remove substantially all acid off the substrate. The slow replacement step substantially eliminates any water from the substrate edges (a meniscus). After another sequence of quick DI water fills and partial dumps, another gaseous mixture, including carrier gas and cleaning enhancement substance, replaces the DI water. Substantially, all water is removed from the substrate at this time. The cleaning enhancement substance reduces the surface tension of the liquid on the substrate to enhance fluid flow therefrom. During removal of the liquid, it pulls particles off the substrate surfaces, thereby cleaning the substrate. To further dry the substrate and carrier, warm or hot nitrogen is pulsed into the vessel. The nitrogen includes a temperature ranging from about 70° F. to about 250° F.

As previously noted, alternative embodiments use a gas without any polar organic compound or the like to replace the DI water. In such embodiments, the gas replaces the DI water at a rate of about 2.50 mm/second or less as measured from the substrate face, and preferably at a rate of about 1.25 mm/second and less, and more preferably at a rate of about 0.80 mm/second or less. The gas without any polar organic compounds or the like may also be nitrogen at a temperature ranging from about 70° F. to about 250° F. To further dry the substrate and carrier, warm or hot nitrogen is pulsed into the vessel. The nitrogen includes a temperature ranging from about 70° F. to about 250° F.

The aforementioned methods also include the use of a certain substrate support and a substrate carrier support to enhance wicking or to draw liquid away from the substrate and carrier. For example, the substrate support includes a knife edge that lifts the substrates to prevent accumulation of water at the substrate edges, and in particular the substrate bottom edges. The substrate carrier support wicks or draws the water from the surface of the substrate carrier, and also puts a slight tilt from horizontal on such carrier.

The slight tilt of the substrate carrier also tilts the substrates, which tends to prevent them from sticking to each other. As previously noted, sticking substrates often accumulate water therebetween. The accumulation of water also accumulates particles, which may be in the water. By removing the water and particles from the substrate, the present method provides higher device yields on a typical semiconductor substrate.

Figure 10A:
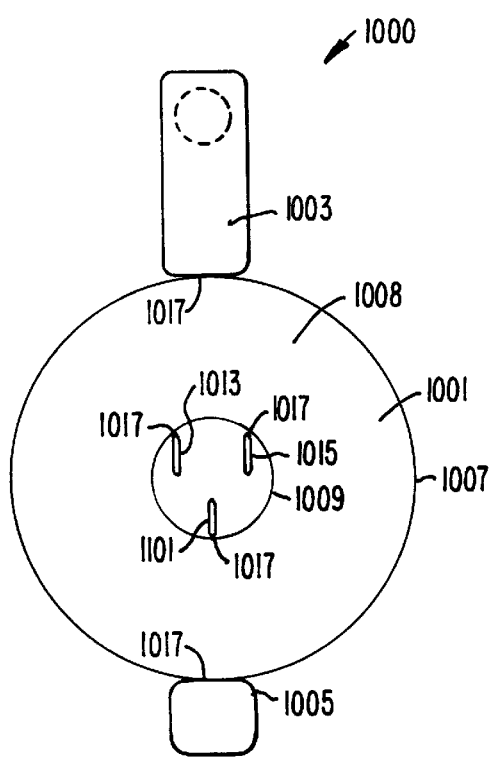
FIGS. 10A–10B are simplified cross-sectional view diagrams of an alternative embodiment of a substrate carrier according to the present invention.
Figure 10B:
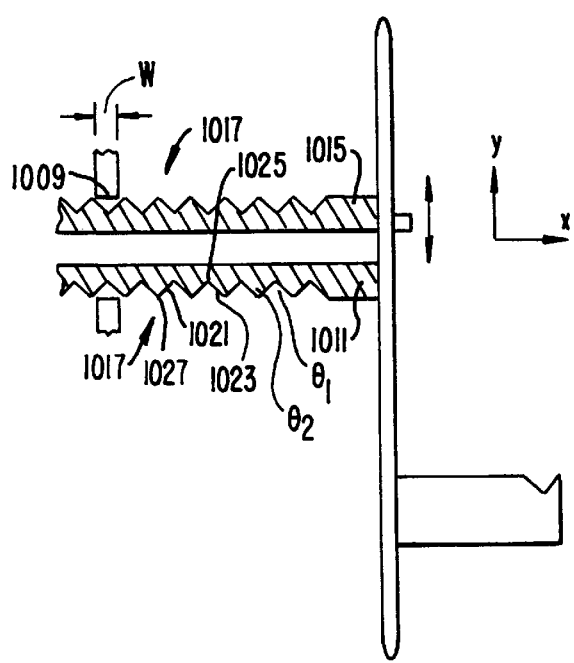

FIGS. 10A–10B are simplified cross-sectional view diagrams of a substrate carrier 1000 according to the present invention. This substrate carrier is for a disk 1001 or the like. The substrate carrier includes a lower support beam 1005, an upper support beam 1003, and a plurality of center support beams 1011, 1013, and 1015. The support beams support or hold the disk 1001 in its place. The disk is often a flat circular shaped article with an opening in its center region. The disk can be made of almost any type of material such as metal, plastic, and others. This disk has an inner periphery 1009, an outer periphery 1007, a face 1008, and other elements. In this embodiment, the inner periphery 1009 and the outer periphery 1007 are circular in shape. But the shape also can be square, rectangular, or the like. The face is substantially flat, but may also have small ridges thereon. In certain embodiments, the face can be porous.

The support beams also have knife edges 1017 that draw fluid or liquid away from the disk by breaking the surface tension of the fluid or liquid attached to the disk. Typically, the fluid or liquid accumulates along edges of the inner and outer periphery. The support beams are located surrounding the periphery of the disk to draw fluid evenly from the disk. Preferably, the support beams are spaced apart from each other at a relatively equal distance.

The center support beams are illustrated by FIG. 10B. The center support beams include the upper center support beams 1013, 1015, and the lower center support beam 1011. Preferably, each of the support beams has a knife edge 1017 or ridges thereon. The ridges have outer bevelled portions 1021, 1023, a lower center portion 1025, and a higher center portion 1027. Preferably, the lower center portion is defined at a lower region where the bevelled portions meet. The upper center portion is defined at a higher region where the bevelled portions meet. An angle $\theta_1$ defining the lower center portion between the bevelled portions ranges from about 85 to about 150°, and is preferably about 90 to about 120°. An angle $\theta_2$ defining the upper center portion between the bevelled portions ranges from about 85 to about 150°, and is preferably about 90 to about 120°. The angles $\theta_1$, $\theta_2$ are selected to draw liquid or fluid away from the disk, thereby enhancing fluid flow or drying.

One of the center support beams is adjustable in the y-direction. In this embodiment, the upper center support beam 1015 adjusts its location along the y-axis. This adjustment also allows the upper center support beam to firmly engage and hold the inner periphery 1009 of the disk 1001. Engagement of the center support beams onto the inner periphery of the disk draws residual fluid on edges of the inner periphery along each center support beam. Preferably, the upper center support beam is also adjustable in the x-direction. More preferably, each of the center support beams is adjustable in both the x-direction and the y-direction in the same plane. This adjustment allows for the center support beams to engage with the inner periphery of the disk.

The center support beam can be made of any suitable material, but its surface is preferably hydrophilic to draw water away from the disk (refer to arrows). The surface can be made of metal such as stainless steel, steel alloys, or others. The surface also can be made of plastics, glass, quartz, or the like. The material needs to have sufficient strength for durability, chemical resistance, and structural integrity. Of course, the type of material used and its surface depend upon the application.

FIGS. 11A–11F are simplified diagrams of a further alternative embodiment 1100 of a substrate carrier according to the present invention. FIG. 11A is a side-view diagram of the substrate carrier 1100. The substrate carrier includes a plurality of walls 1101 and a plurality of substrates 1102 disposed therebetween. The substrates can be almost any type of substrate such as a semiconductor wafer or the like. Of course, the type of substrate used depends upon the particular application. Generally, fluid accumulates on edges of the substrate after cleaning or removing liquid from the substrate surfaces.

A plurality of lower substrate supports 1106, 1108, and an upper substrate support 1104 are also shown. Each of the substrate supports has knife edges 1107 engaged along the substrates' edges, which are used to draw fluid or liquid from the substrate edges. As previously noted, the knife edges break the surface tension of the fluid on the substrate edges, and draw such fluid often with particles therefrom. This tends to remove residual or unwanted fluid from the substrate, and in particular the substrate edges.

A front-view diagram of the substrate carrier 1100 is shown by FIG. 11B. The front-view diagram includes the substrate 1102 having a face 1112 and substrate edges 1111 (or an outer periphery). Three lower substrate supports 1106, 1108 are located near the bottom portion of the substrate 1102. Lower substrate support 1106 is located at a center bottom portion of the substrate, and is perpendicular to the x-direction. Lower substrate supports 1108 are located perpendicular to the x-direction at an upper bottom portion of the substrate. These substrate supports are disposed along the bottom surface of the substrate to support such substrates, and draw any residual liquid from the substrate edges. The upper substrate support 1104 is disposed perpendicular to the x-direction, and engages with an upper center portion of the substrate. Preferably, the upper center portion is in-line in the y-direction with lower substrate support 1106, but also can be at other locations. Preferably, the upper substrate support 1104 firmly engages with the upper center portion of the substrate. This upper substrate support 1104 breaks the surface tension of fluid on the substrate edges, and draws such fluid off, thereby enhancing substrate drying.

FIGS. 11C and 11D illustrate a top-view diagram of the substrate carrier and a bottom-view diagram of the substrate carrier, respectively. As shown, the upper substrate support 1104 is located overlying a center portion of the substrates along the z-direction. Bottom substrate supports 1106, 1108 run parallel to each other in the z-direction. These substrates supports also are spaced evenly among each other. Alternatively, the upper substrate support and bottom substrate support also can be at other locations.

FIGS. 11E and 11F illustrate an example of a substrate support according to the present invention. This substrate support can be any of the above substrate supports 1104, 1106, and 1108. The substrate support 1117 includes a notched portion which engages with a side 1115 of the substrate carrier. This notched portion on the substrate support can be adapted to any conventional substrate carriers for use with the present invention. Engagement between the substrate support 1117 and the side 1115, however, also can occur using other techniques such as welding, bonding, or other engagement means.

The substrate support can be made of any suitable material, but its surface is preferably hydrophilic to draw water away from the substrate (refer to arrows). The surface can be made of metal such as stainless steel, steel alloys, or others. The surface also can be made of plastics, glass, quartz, or the like. The material needs to have sufficient strength for durability, chemical resistance, and structural integrity. Of course, the type of material used and its surface depend upon the application.

Each of the support beams has a knife edge 1107 or ridges thereon. The ridges have outer bevelled portions 1121, 1123, a lower center portion 1125, and a higher center portion 1127. Preferably, the lower center portion is defined at a lower region where the bevelled portions meet. The upper center portion is defined at a higher region where the bevelled portions meet. An angle $\theta_1$ defining the lower center portion between the bevelled portions ranges from about 85 to about 150°, and is preferably about 90 to about 120°. An angle $\theta_2$ defining the upper center portion between the bevelled portions ranges from about 85 to about 150°, and is preferably about 90 to about 120°. The angles $\theta_1$, $\theta_2$ are selected to draw liquid or fluid away from the disk, thereby enhancing fluid flow or drying.

In addition, the aforementioned cleaning method occurs without movement of the substrate. In fact, the substrate carrier remains substantially stationary after being immersed, and during the drying, cascade rinse, and other steps. By way of less movement, the system has fewer mechanical parts and is often easier to use and maintain than certain prior art systems.

Moreover, the amount of polar organic compound used for each batch of substrates is typically less than a fraction of a milliliter. The use of less organic compounds is often advantageous to the highly flammable prior art methods of drying a substrate by way of IPA for example. In certain embodiments, no polar organic compounds or the like are used. Accordingly, the present method is less hazardous than certain prior art methods to both health and environment.

The aforementioned embodiments also are used in other selected semiconductor fabrication process steps. In one embodiment, the cleaning technique occurs in pre-gate oxide cleans. Pre-gate oxide cleans were generally not performed due to the sensitivity of gate oxide layer formation. That is, convention pre-gate oxide cleans were not performed due to the introduction of particles onto the semiconductor substrate. The present technique, however, actually removes any particles that may remain on the surfaces of the substrate before gate oxide layer formation, thereby improving the general quality of the gate oxide layer. The present technique removes substantially all particles greater than about 0.5 microns, and preferably 0.2 microns, and more preferably 0.1 microns.

In an alternative specific embodiment, the present cleaning technique can be applied before other semiconductor process applications. These process applications are described in great detail in a text written by Stanley Wolf and Richard N. Tauber, Semiconductor Processing For The VLSI Era, Vol. 1: Process Technology (1986) (herein "WOLF"). For example, the present technique is applied as a pre-epitaxial, pre-diffusion, pre-metal, pre-poly, pre-implant, pre-photoresist, and pre-stack oxide cleaning techniques. Generally, the present cleaning technique can be applied at room temperature with trace quantities of polar organic compound. The trace quantity of polar organic compound at room temperature does not generally detrimentally influence the semiconductor or photoresists. As noted in the background of invention, photoresists often dissolve during high temperature processing using solvents. As also previously noted, the present technique actually removes particles, rather than introducing them.

In an alternative embodiment, the present cleaning technique can be applied after performing a selected semiconductor fabrication process. An example of this fabrication process includes nitride deposition, polish cleans (e.g., CMP), buffered oxide etches, and metal deposition. These process steps also are described in great detail in a text written by WOLF. Additional applications of the present cleaning technique also can be applied for hydrofluoric acid last recipes and critical metal oxide silicon etches. As previously noted, the present technique actually removes particles from the semiconductor, rather being another process that introduces them.

EXPERIMENTS

To prove the principle and demonstrate the operation of the present method and apparatus, experiments were performed.

In these experiments, a 6-inch silicon wafer was used as a substrate. The 6 inch silicon wafer included an overlying layer of high quality silicon dioxide, typifying a recently HF etched wafer with an overlying oxide layer. The 6-inch silicon wafer was placed in a wafer carrier, which was immersed into a bath of rinse water in a vessel. In the vessel, the 6-inch silicon wafer was at a substantially vertical position, that is, faces of the wafer were substantially normal to the water level. The water is standard rinse water and included a resistance of about 17 megohms, and had a temperature of about 70° F. In the immersed position, the wafer was substantially wet.

To dry the wafer, water was drained from the bottom of vessel. The water level was substantially normal to the wafer faces. The water was drained at a substantially constant rate from the bottom of the vessel. During the draining step, the wafer remained substantially motionless.

By way of an adjustable outlet valve at the drain, a different drain speed in multiple runs was used to determine the particular drain rates at which drying occurred more effectively. Drain speed is measured by the amount of time necessary to drain the water from the vessel in terms of decreasing water level measured in millimeters per second (mm/sec.).

Figure 12:
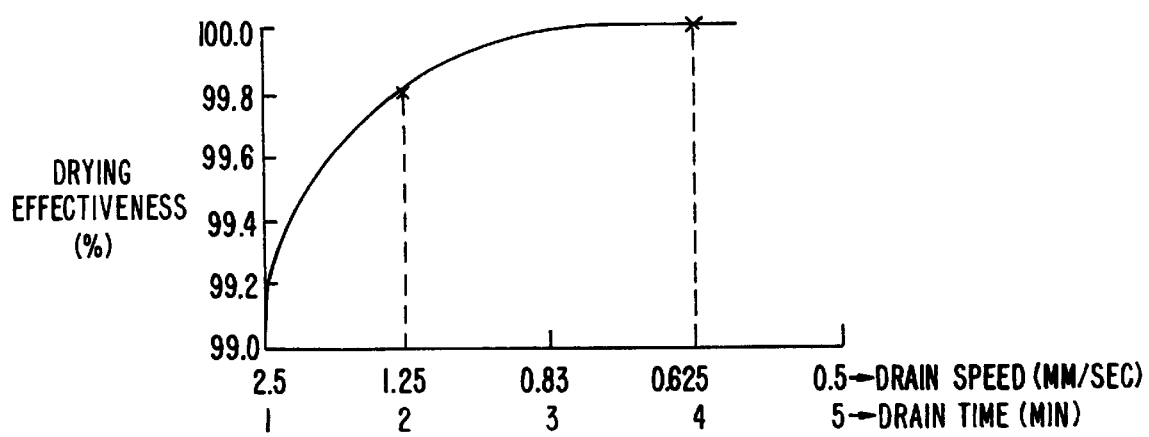
FIG. 12 illustrates drying effectiveness as a function of drain speed for an experiment performed according to the present invention.

FIG. 12 illustrates a "drying effectiveness" as a function of drain speed (in millimeters per second). The drying effectiveness is a surface area percentage of the wafer without water residue, measured as a percentage. The surface area of the wafer includes the faces and wafer edges. As noted above, it is quite important to remove all water from the wafer which often includes a meniscus at the wafer edges. As shown, the drying effectiveness in this experiment is a non-linear function with respect to drain speed. For example, the drying effectiveness of the sample wafer is about 99.0% at a drain speed of about 2.5 mm/sec. A drain speed of about 1.25 mm/sec. has a drying effectiveness of about 99.8%. A drying effectiveness of about 100% (or completely dry wafer excluding wafer edges) was produced with a drain speed of about 0.83 mm/sec. and less. Any residual water on the wafer edges was removed by hot dry nitrogen being introduced for about 2 minutes or less.

This experiment shows that a substantially clean and dry wafer may be produced by way of an embodiment of the present process. This present process does not rely upon any potentially harmful organic solvents or the like. In addition, the present process provides a substantially clean and dry wafer without mechanical movement of the wafer thereby decreasing the possibility of any mechanical damage of the wafer loss due to machine malfunction. Furthermore, the substantially wafer may be provided without the use of a heater or heating element, thereby decreasing hazards of fire and such. Accordingly, this experiment shows a safe, efficient, and easy method of drying and cleaning a wafer according to the present invention.

While the above is a full description of the specific embodiments, various modifications, alternative constructions, and equivalents may be used. For example, while the description above is in terms of a method and apparatus for semiconductor substrates, it would be possible to implement the present invention to the manufacture of raw wafers, disks and heads, flat panel displays, microelectronic masks, and other applications requiring high purity wet processing such as steps of rinsing, drying, cleaning, and the like. In addition, the systems of FIGS. 1–5 are in terms of a cleaning system for semiconductors. A skilled artisan may, alteratively, employ such systems to other industries such as electrochemical, pharmaceutical, printed circuit board, optical devices, and any other industry that needs an improved technique to rinse and dry an article of manufacture. Furthermore, the apparatus of FIGS. 6–11F are in terms of the present cleaning system, but also can be employed in any other cleaning system, drying system, rinse system, or the like.

Therefore, the above description and illustrations should not be taken as limiting the scope of the present invention which is defined by the appended claims.

What is claimed is:

1. A method for cleaning a photoresist patterned wafer, said method comprising the steps of:
   immersing a photoresist patterned wafer comprising a face in a liquid comprising water, said water being substantially free from particles greater than about 0.5 micron in diameter;
   providing a substantially particle free environment adjacent to said face as said liquid is being removed, said substantially particle free environment comprising a gas that is substantially free from particles greater than about 0.5 micron in diameter; and
   introducing a cleaning enhancement substance during said providing step, said cleaning enhancement substance doping said liquid which is attached to said face to cause a concentration gradient of said cleaning enhancement substance in said attached liquid to accelerate fluid flow of said attached liquid off of said face of said photoresist patterned wafer, said cleaning enhancement substance comprising a non-saturated compound.

2. The method of claim 1 wherein said photoresist patterned wafer is substantially free from mechanical movement during said providing step and introducing step to decrease a possibility of any substantial damage to said photoresist patterned wafer.

3. The method of claim 1 further comprising a step of introducing a drying source adjacent to said photoresist patterned wafer, said drying source removing said liquid attached to an edge of said photoresist patterned wafer.

4. The method of claim 1 wherein said providing step leaves a boundary layer of said liquid attached to said face.

5. The method of claim 4 wherein said boundary layer is about 1,000 Å and less.

6. The method of claim 4 wherein said boundary layer is about 100 Å and less.

7. The method of claim 1 wherein said cleaning enhancement substance is selected from a group consisting of a surfactant, isopropyl alcohol, di-acetone alcohol, helium, carbon dioxide, ammonia, and 1-methoxy-2-propanol.

8. The method of claim 1 wherein said liquid during said introducing step removes particles off said face.

9. The method of claim 8 wherein some particles are each substantially greater than about 0.2 microns in diameter.

10. The method of claim 1 wherein said liquid is substantially free from particles greater than about 0.2 microns in diameter.

11. The method of claim 1 wherein said cleaning enhancement substance is mixed with a carrier gas, said carrier gas being selected from a group consisting of air, nitrogen, inert gas, and argon.

12. The method of claim 1 wherein said cleaning enhancement substance is mixed with a carrier gas, said carrier gas comprising said cleaning enhancement substance being mixed with said substantially particle free environment.

13. The method of claim 1 wherein said photoresist patterned wafer is disposed in a carrier, whereupon the carrier is tilted at an angle from a vertical position.

14. The method of claim 13 wherein said angle is less than about 15 degrees from said vertical position.

15. The method of claim 11 wherein said photoresist patterned wafer is substantially free from oxidation before said immersing.

16. The method of claim 1 wherein said cleaning enhancement substance is a non-saturated polar organic compound ranging in concentration from about 1,000 ppm and less.

17. The method of claim 1 wherein said cleaning enhancement substance is a non-saturated polar organic compound ranging in concentration from about 500 ppm and less.

18. The method of claim 1 wherein said liquid is removed at a rate of about 5.0 mm/sec. or less as measured from said face.

19. The method of claim 1 wherein said liquid is removed at a rate between about 0.25 mm/sec. and 5.0 mm./sec. as measured from said face.

20. The method of claim 1 wherein said liquid is removed at a rate between about 0.5 mm/sec, and 2.5 mm./sec. as measured from said face.

21. A method for cleaning photoresist patterned wafers having surfaces, said method comprising the steps of:

immersing wafer comprising a pattern of photoresist thereon in a liquid comprising water, said water being substantially free from particles greater than about 0.5 micron in diameter; and providing a substantially particle free environment adjacent to said photoresist pattern, said substantially particle free environment comprising a gas that is substantially free from particles greater than about 0.5 micron in diameter; and introducing a carrier gas comprising a cleaning enhancement substance and mixing said carrier gas with said substantially particle free environment, said cleaning enhancement substance doping said liquid which is attached to said photoresist pattern to cause a concentration gradient of said cleaning enhancement substance in said attached liquid to accelerate fluid flow of said attached liquid off of said wafer, said cleaning enhancement substance comprising a non-saturated compound.

22. The method of claim 21 wherein said wafer is substantially free from any mechanical movement during said providing step and introducing step to prevent a possibility of any substantial damage to said wafer.

23. The method of claim 21 wherein said carrier gas is at a temperature ranging from about 75° F. to about 175° F.

24. The method of claim 21 wherein said carrier gas is at about 70° F.

25. The method of claim 21 wherein said cleaning enhancement substance is derived from less than amilliliter of organic compound.

26. A method for cleaning objects having surfaces, said method comprising:

immersing an object comprising a face having a pattern of photoresist thereon in a liquid comprising water, said water being substantially free from particles greater than about 0.5 microns; and providing a substantially particle free environment adjacent to said pbotoresist pattern said substantially particle free environment being substantially free from particles greater than about 0.5 microns; and wherein said liquid is removed at a selected rate of about 5.0 mm/sec. or less as measured from said face and is replaced by said substantially particle free environment accelerating fluid flow of attached liquid off of said photoresist pattern.

27. The method of claim 26 wherein said object is substantially free from mechanical movement during said providing to prevent a possibility of any substantial damage to said object.

28. The method of claim 26 wherein said substantially particle free environment is substantially free from particles greater than about 0.1 microns.

29. The method of claim 26 wherein said object is substantially free from particles greater than about 0.1 microns.

30. The method of claim 26 wherein said object is a patterned semiconductor wafer.

31. The method of claim 26 further comprising a step of introducing a drying source adjacent to said object said drying source removing said liquid attached to an edge of said object.

* * * * *